(12) United States Patent
Takahashi

(10) Patent No.: US 7,859,927 B2
(45) Date of Patent: Dec. 28, 2010

(54) SEMICONDUCTOR STORAGE DEVICE AND METHOD OF CONTROLLING THE SAME

(75) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 170 days.

(21) Appl. No.: 12/257,921

(22) Filed: Oct. 24, 2008

(65) Prior Publication Data
US 2009/0122630 A1     May 14, 2009

(30) Foreign Application Priority Data
Nov. 14, 2007   (JP) .............................. 2007-295162

(51) Int. Cl.
*G11C 7/02* (2006.01)
(52) U.S. Cl. ...................... 365/207; 365/205
(58) Field of Classification Search ................. 365/207, 365/205, 189.11
See application file for complete search history.

(56) References Cited

U.S. PATENT DOCUMENTS

| 5,243,573 | A   | * | 9/1993 | Makihara et al. ....... 365/185.21 |
| 7,352,640 | B2  | * | 4/2008 | Fort et al. .................... 365/205 |
| 2008/0159036 | A1 | * | 7/2008 | Leung ........................ 365/207 |

FOREIGN PATENT DOCUMENTS

JP           10-269772           10/1998

* cited by examiner

*Primary Examiner*—Anh Phung
(74) *Attorney, Agent, or Firm*—Young & Thompson

(57) ABSTRACT

An exemplary aspect of the present invention is a sense amplifier having a power supply voltage of 1.2 V or lower and amplifying a potential difference between a bit line pair, a first transistor supplying the power supply voltage to the sense amplifier, a second transistor supplying a low potential side voltage to the sense amplifier, and a control circuit controlling the first transistor to be a conduction state before the second transistor is set to the conduction state or at the same time when the second transistor is set to the conduction state.

7 Claims, 12 Drawing Sheets

SEMICONDUCTOR STORAGE DEVICE AND METHOD OF CONTROLLING THE SAME

BACKGROUND

1. Field of the Invention

The present invention relates to a semiconductor storage device, and more specifically, to a semiconductor storage device and a method of controlling the same which enable stable operation of a sense amplifier.

2. Description of Related Art

Electronic devices such as a computer generally include data storing means storing data. One of the semiconductor storage devices employed as the data storing means includes DRAM (Dynamic Random Access Memory). The DRAM has a relatively simple structure, which enables high integration.

FIG. 10 shows one example of a typical DRAM circuit as a related art. As shown in FIG. 10, a DRAM circuit 1 includes a memory cell 10 and a sense amplifier 20 connected to a bit line pair formed of bit lines DT and DB. A PMOS transistor 25 is connected between the sense amplifier 20 and a power supply voltage terminal 30, and an NMOS transistor 26 is connected between the sense amplifier 20 and a ground terminal 31.

A gate of the PMOS transistor 25 is connected to a signal line 52 transmitting a control signal SAP. A gate of the NMOS transistor 26 is connected to a signal line 53 transmitting a control signal SAN.

The memory cell 10 includes a gate transistor 11 and a capacitor 12 for storing data. The gate transistor 11 is connected between the bit line DT and the capacitor 12, and a word line 51 transmitting a word select signal WL is connected to a gate of the gate transistor 11.

The sense amplifier 20 includes PMOS transistors 21 and 22 and NMOS transistors 23 and 24. The PMOS transistor 21 and the NMOS transistor 23, and the PMOS transistor 22 and the NMOS transistor 24 are connected in series between the nodes A1 and A2, respectively. Further, a drain of the PMOS transistor 21 and a drain of the NMOS transistor 23 are connected to the bit line DT, and a drain of the PMOS transistor 22 and a drain of the NMOS transistor 24 are connected to the bit line DB. A gate of the PMOS transistor 21 and a gate of the NMOS transistor 23 are connected to the bit line DB, and a gate of the PMOS transistor 22 and a gate of the NMOS transistor 24 are connected to the bit line DT.

When the word select signal, WL is raised, the gate transistor 11 is turned on. Accordingly, the bit line DT and the capacitor 12 are electrically connected and the charge is supplied to the bit line DT. Hence, there is caused a small potential difference between the bit lines DT and DB. The sense amplifier 20 which is activated amplifies the potential difference to the power supply voltage and the ground voltage. Then the data stored in the capacitor 12 is read out by the amplified potential difference.

When the sense amplifier 20 is activated, one of the bit lines DT and DB which has a higher potential is raised to the power supply voltage VDD through the PMOS transistors 21 and 22, and the other of the bit lines DT and DB which has a lower potential is lowered to the ground voltage VSS through the NMOS transistors 23 and 24. The operation of raising the potential of the bit line to the power supply voltage VDD is started by turning on the PMOS transistor 25, and the operation of lowering the potential of the bit line to the ground potential VSS is started by turning on the NMOS transistor 26.

Generally, as a timing at which the sense amplifier 20 is activated, the NMOS transistor 26 is turned on earlier than the PMOS transistor 25, and the NMOS transistors 23 and 24 are operated earlier than the PMOS transistors 21 and 22. The operation of operating the NMOS transistor earlier than the PMOS transistor is effective for stabilizing the operation of the sense amplifier 20.

This is because current driving ability and balance of the threshold value voltage of the transistors forming the sense amplifier influence on the important factor for determining the sensitivity of the sense amplifier. For example, regarding the influence of the balance of the threshold value voltage, if the difference of the threshold value voltages of the transistors 21 to 24 forming the sense amplifier 20 is at least 100 mV, then the sensitivity of the sense amplifier decreases by 100 mV. The PMOS transistor generally has a lower current driving ability, higher threshold value voltage Vth, and larger variation of the threshold value voltage Vth than the NMOS transistor. Therefore, it is needed for the stable operation of the sense amplifier 20 to operate the NMOS transistor earlier whose current driving ability is higher, the threshold value voltage Vth is relatively lower, and the variation of the threshold value voltage Vth is smaller.

Now, if the power supply voltage decreases down to around 3.3 V, the current driving ability of the PMOS transistor 25 connected between the sense amplifier 20 and the power supply voltage terminal 30 decreases, and the delay occurs in the amplification operation of the potential difference between the bit lines DT and DB. Therefore, a technique of preventing the delay of the amplification operation of the potential difference between the bit lines DT and DB by the sense amplifier in the power supply voltage of around 3.3 V is disclosed in Japanese Unexamined Patent Application Publication No. 10-269772. FIG. 11 shows a circuit of Japanese Unexamined Patent Application Publication No. 10-269772. FIG. 12 shows a timing chart of this circuit. In Japanese Unexamined Patent Application Publication No. 10-269772, the sense amplifier 20 is overdriven by VPP which is higher than the power supply voltage VDD. The transistor 25 between the high voltage VPP and the sense amplifier is turned on earlier than the transistor 26 between the ground voltage and the sense amplifier. Hence, even when the power supply voltage VDD is around 3.3 V and the current driving ability of the PMOS transistor decreases, the speed of the amplification operation of the potential difference between the bit lines DT and DB is not lowered due to the sense amplifier 20. Although the sense amplifier 20 disclosed in Japanese Unexamined Patent Application Publication No. 10-269772 is overdriven by the high voltage VPP from time t2 to t3, time t3 at which the NMOS transistor starts the operation is earlier than time t4 at which the voltage is raised to the power supply voltage VDD.

Along with the miniaturization and high integration of the recent manufacturing process, the variation of the threshold value voltage of the PMOS transistor is about the same or smaller than the variation of the threshold value voltage of the NMOS transistor depending on the generations of the manufacturing process.

Further, the power supply voltage has been decreasing, which is typically around 3.3 V or lower. For example, the power supply voltage has been decreasing down to about 1.2 V or lower such as a DRAM embedded system LSI. Although the power supply voltage has been decreasing, the threshold value voltage of the transistor has not changed that much. Therefore, the ratio of the threshold value voltage to the power supply voltage has been larger than before.

In order to stably operate the sense amplifier in high speed with low voltage, the factor of the threshold value voltage of the transistor has a greater influence on the operation than the factor of the current driving ability of the above transistor. Accordingly, the variation of the threshold value voltage of the transistor due to the manufacturing process directly influences on the stable high speed operation of the sense amplifier.

Therefore, in order to keep the high speed operation and the stability of the sense amplifier, it is needed to employ the transistor having a smaller variation in the threshold value voltage. Therefore, there is a problem in a technique of operating the NMOS transistor of the sense amplifier earlier than the PMOS transistor as in the related art.

SUMMARY

The present inventors have found a problem as follows. In the related art, the NMOS transistor of the sense amplifier is operated earlier than the PMOS transistor. With reduced power supply voltage such as 1.2 V or lower, the ratio of the threshold value voltage of the transistor of the sense amplifier to the power supply voltage is large. Accordingly, the variation of the threshold value voltage of the transistor influences on the stability of the operation of the sense amplifier; therefore, there is a demand for a sense amplifier operating the PMOS transistor with reduced variation of the threshold value voltage earlier than the NMOS transistor or at the same time when the NMOS transistor is operated.

A first exemplary aspect of an exemplary embodiment of the present invention is a semiconductor storage device, including a sense amplifier having a power supply voltage of 1.2 V or lower and amplifying a potential difference between a bit line pair, a first transistor supplying the power supply voltage to the sense amplifier, a second transistor supplying a low potential side voltage to the sense amplifier, and a control circuit controlling the first transistor to be a conduction state before the second transistor is set to the conduction state or at the same time when the second transistor is set to the conduction state.

A second exemplary aspect of an exemplary embodiment of the present invention is a method of controlling a semiconductor storage device including a sense amplifier having a power supply voltage of 1.2 V or lower and amplifying a potential difference between a bit line pair, a first transistor supplying the power supply voltage to the sense amplifier, and a second transistor supplying a low potential side voltage to the sense amplifier, in which the first transistor is set to a conduction state before the second transistor is set to the conduction state or at the same time when the second transistor is set to the conduction state.

According to the semiconductor storage device and the method of controlling the same of the present invention, it is possible to operate the sense amplifier with stability since the PMOS transistor forming the sense amplifier, raising a voltage of one of the bit lines to the power supply voltage, and having reduced variation of the threshold value voltage is operated earlier than the NMOS transistor or at the same time when the NMOS transistor is operated.

According to the semiconductor storage device and the method of controlling the same of the present invention, the operation of the sense amplifier can be stabilized.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
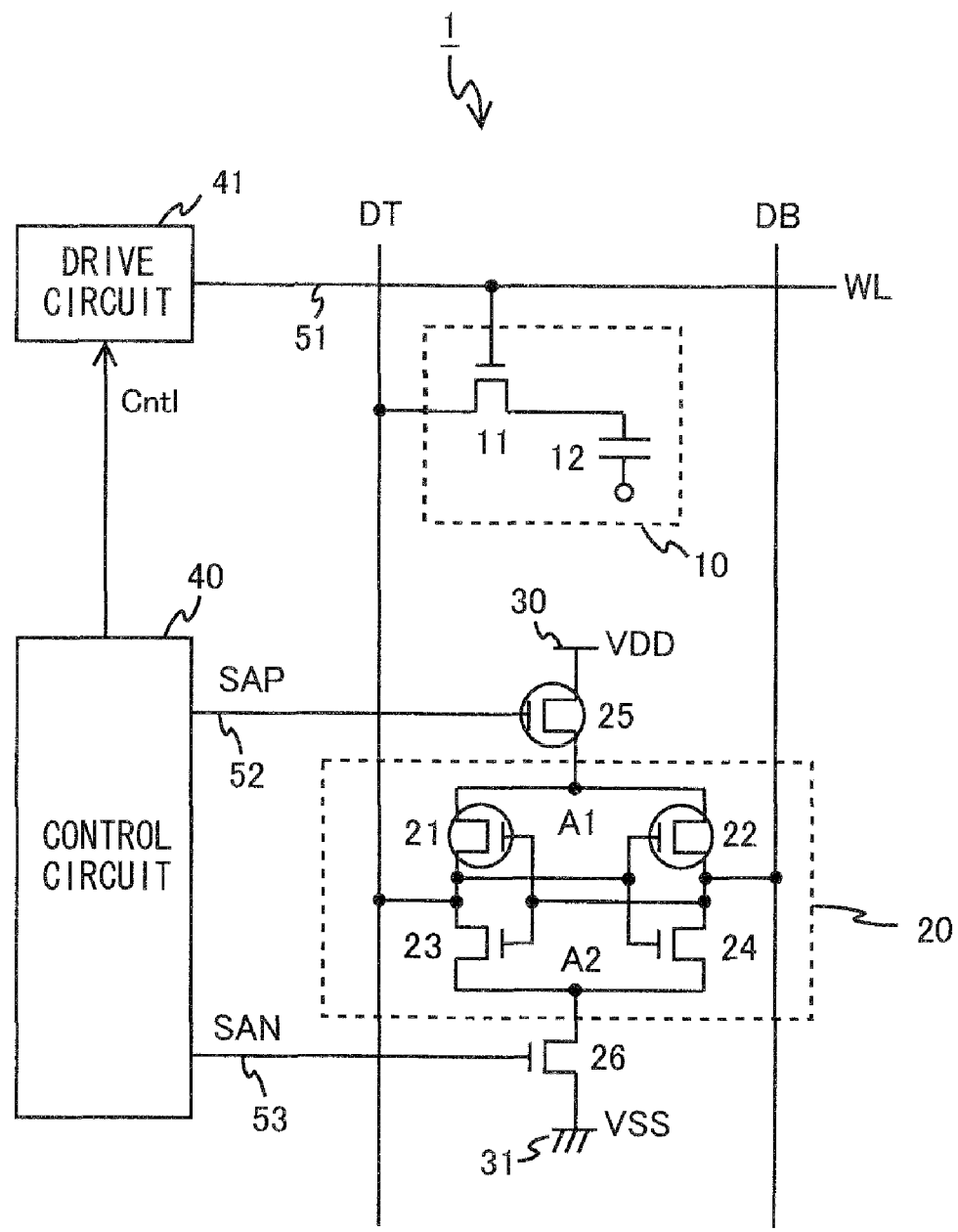
FIG. 1 is a configuration of a DRAM circuit according to a first exemplary embodiment.

The first exemplary embodiment of the present invention will be described hereinafter with reference to the drawings. In the first exemplary embodiment, explanation will be made on a DRAM circuit as one example of semiconductor storage devices. FIG. 1 shows a configuration of a DRAM circuit 1. As shown in FIG. 1, the DRAM circuit 1 includes a memory cell 10, a bit line pair formed of bit lines DT and DB, a sense amplifier 20, a PMOS transistor 25 (first transistor), an NMOS transistor 26 (second transistor), a power supply voltage terminal 30, a ground voltage terminal 31, a control circuit 40, and a drive circuit 41. The memory cell 10 is connected to the bit line DT, and the sense amplifier 20 is connected between the bit lines DT and DB. The PMOS transistor 25 is connected between the sense amplifier 20 and the power supply voltage terminal 30. The NMOS transistor 26 is connected between the sense amplifier 20 and the ground terminal 31.

The memory cell 10 includes a gate transistor 11 and a capacitor 12 for storing data. The gate transistor 11 is connected between the bit line DT and the capacitor 12, and a word line 51 is connected to a gate of the gate transistor 11.

The drive circuit 41 drives the word line 51 and generates a word select signal WL controlling a conduction state of the gate transistor 11. The word line 51 transmits the word select signal WL controlling the conduction state of the gate transistor 11. Hence, when the word select signal WL is in a high level, the gate transistor 11 is in the conduction state, and the bit line DT and the capacitor 12 are electrically connected. Accordingly, data stored in the capacitor 12 is transmitted to the bit line DT.

Although FIG. 1 only shows one memory cell 10 and one sense amplifier 20 for the sake of clarity, the DRAM circuit 1 may include a plurality of memory cells in a direction in which the word line is extended. Further, the DRAM circuit 1 may include a plurality of pairs of bit lines DT and DB corresponding to the plurality of memory cells and a plurality of sense amplifiers 20 connected to the plurality of pairs of bit lines DT and DB.

The sense amplifier 20 includes PMOS transistors 21 and 22 and NMOS transistors 23 and 24. The PMOS transistor 21 and the NMOS transistor 23, and the PMOS transistor 22 and the NMOS transistor 24 are connected in series between a node A1 and a node A2, respectively. A source of the PMOS transistor 21 is connected to the node A1, a drain thereof is connected to the bit line DT, and a gate thereof is connected to the bit line DB. A source of the PMOS transistor 22 is connected to the node A1, a drain thereof is connected to the bit line DB, and a gate thereof is connected to the bit line DT. A source of the NMOS transistor 23 is connected to the node A2, a drain thereof is connected to the bit line DT, and a gate thereof is connected to the bit line DB. A source of the NMOS transistor 24 is connected to the node A2, a drain thereof is connected to the bit line DB, and a gate thereof is connected to the bit line DT. The sense amplifier 20 amplifies a potential difference of the bit lines DT and DB to a power supply voltage VDD and a ground voltage VSS.

A source of the PMOS transistor 25 is connected to the power supply voltage terminal 30, a drain thereof is connected to the node A1, and a gate thereof is connected to a control line 52. A source of the NMOS transistor 26 is connected to the ground terminal 31, a drain thereof is connected to the node A2, and a gate thereof is connected to a control line 53.

The control circuit 40 transmits a control signal SAP by the control line 52 to control the conduction state of the PMOS transistor 25. Further, the control circuit 40 transmits a control signal SAN by the control line 53 to control the conduction state of the NMOS transistor 26. The control circuit 40 sets the PMOS transistor 25 to the conduction state earlier than setting the NMOS transistor 26 or at the same time when the NMOS transistor 26 is set to the conduction state by the control signals SAP and SAN transmitted by the control lines 52 and 53. Further, the control circuit 40 transmits a control signal Cntl to the drive circuit 41. The drive circuit 41 makes the word select signal WL high level by this control signal Cntl. The timing at which the word select signal WL is made the high level is controlled by the control circuit 40 so that it is before the operation of changing the state of the PMOS transistor 25 and the NMOS transistor 26 to the conduction state by the control signals SAP and SAN.

The power supply voltage terminal 30 supplies the power supply voltage VDD of 1.2 V or lower. The power supply voltage VDD may be set so that the value is at most 1.42 times larger than the sum of the threshold value voltages of the NMOS transistors 23 and 24 and the PMOS transistors 21 and 22 forming the sense amplifier 20. This means that the sum of the threshold value voltages of the NMOS transistors 23 and 24 and the PMOS transistors 21 and 22 is substantially 70% or more with respect to the power supply voltage VDD. The ground terminal 31 outputs the ground voltage VSS.

Figure 2A:
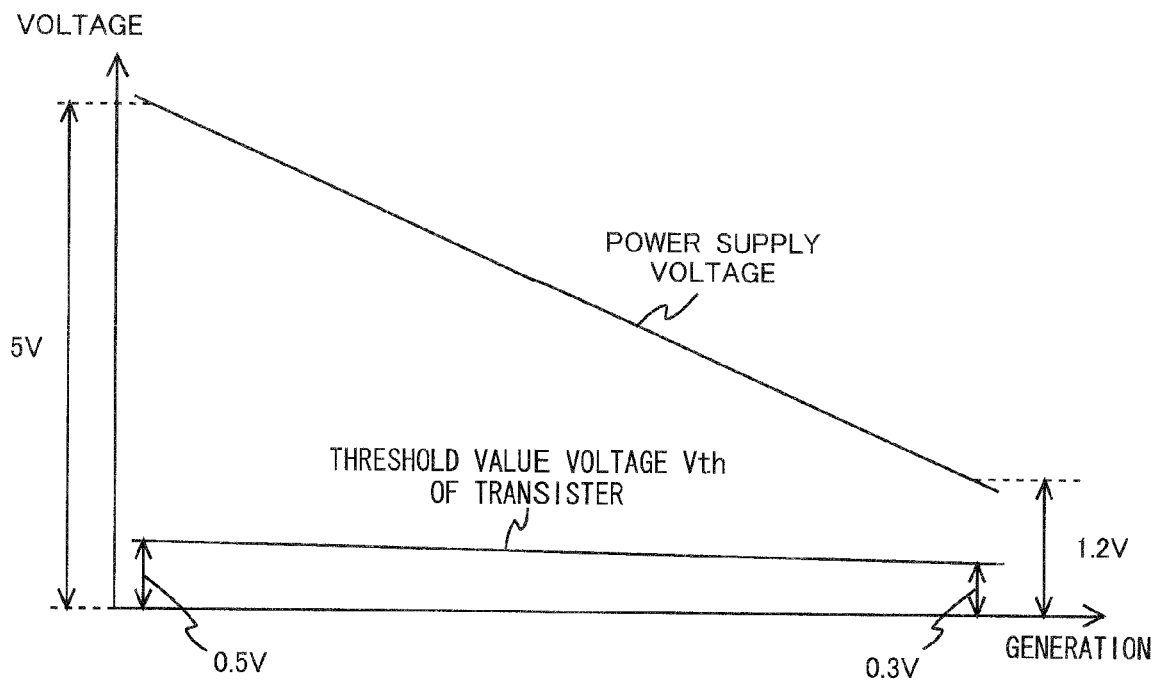
FIG. 2A is a graph showing a relation between a power supply voltage and a threshold value voltage according to generations of the manufacturing process.

As shown in FIG. 2A, the power supply voltage was around 5 V before. In recent years, the power supply voltage has been decreased to around 1.2 V or lower such as in the DRAM-embedded system LSI. Although the power supply voltage has been decreasing, the threshold value voltage Vth of the transistor has been decreased from 0.5 V to 0.3 V, which has not been changed so much. Hence, the ratio of the threshold value voltage Vth to the power supply voltage VDD becomes larger than before. It means that the variation of the threshold value voltage Vth of the transistors 21, 22, 23, 24 due to the manufacturing process directly influences on the sensitivity of the sense amplifier 20, which influences on the high-speed operation or the stability of the operation of the sense amplifier. Accordingly, there is a need to employ a transistor having a smaller variation in threshold value voltage to control the start of the operation.

Figure 2B:
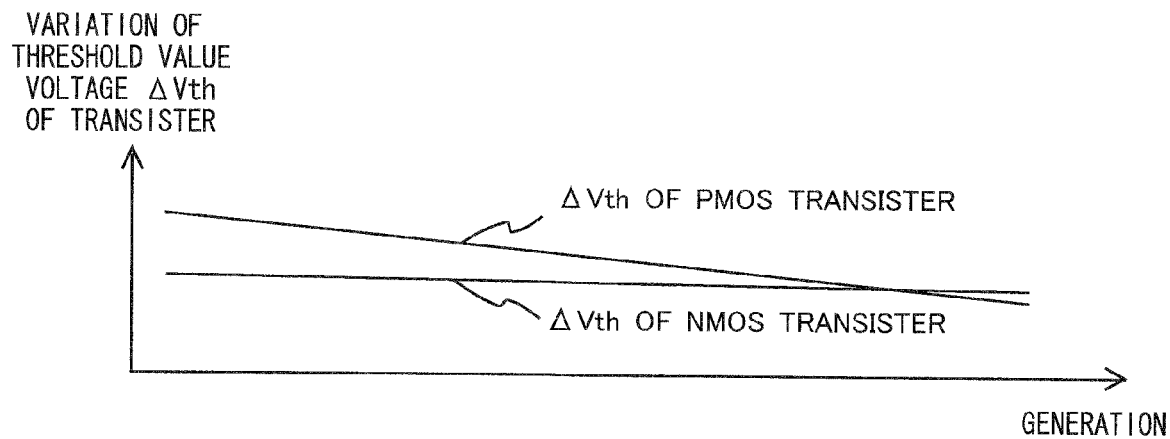
FIG. 2B is a graph showing a relation of variations of threshold value voltages of a PMOS transistor and an NMOS transistor according to the generations of the manufacturing process.

Furthermore, the manufacturing process has been miniaturized and highly integrated in recent years. Accordingly, as shown in FIG. 2B, the variation of the threshold value voltage ΔVth of the PMOS transistor has been decreasing as the power supply voltage VDD of FIG. 2A decreases. An example of the reason why the threshold value voltage of the PMOS transistor greatly decreases compared with the NMOS transistor will be described.

First, since the PMOS transistor has a smaller mobility of a carrier, the transistor width is made larger than that of the NMOS transistor. It is widely known that the variation of the threshold value voltage ΔVth is inversely proportional to the width and length of the transistor. Therefore, the PMOS transistor having a larger width has more advantage than the NMOS transistor in terms of decreasing the variation of the threshold value voltage.

Further, the PMOS transistor employs arsenic (As) for doping impurities in order to form a channel. On the other hand, the NMOS transistor employs boron (B) for doping impurities. The boron has significantly large diffusion coefficient compared with the arsenic, which means the density tends to be varied (variation is occurred) in the channel due to the process such as heat treatment. On the other hand, when arsenic is used, the density does not change so much in the channel even with the process such as the heat treatment. Accordingly, it is possible to stably form the channel in the PMOS transistor, which has a greater advantage than the NMOS transistor in terms of decreasing the variation of the threshold value voltage.

Now, contrary to the dopant in the channel region described above, boron is implanted in the diffusion region (drain region and source region) in the PMOS transistor. Accordingly, the change (variation) of the boron density which has occurred in the channel region of the NMOS transistor occurs in the diffusion region of the PMOS transistor. The PMOS transistor has disadvantage compared with the NMOS transistor in terms of the variation of the density of the impurities in the diffusion region. However, the sense amplifier is not designed by a minimum design standard but is designed with an L shape with some margin so as to minimize the variation of the shape. Accordingly, there is little influence on the gate length direction (Lmin) due to the variation of the density in the diffusion region as described above. Due to the above reason, the variation of the threshold value voltage of the PMOS transistor may be the same or lower compared with that of the NMOS transistor.

Accordingly, the variation of the threshold value voltage of the PMOS transistors 21 and 22 of the sense amplifier 20 employed in the first exemplary embodiment is assumed to be at least the same or less than the variation of the threshold value voltage of the NMOS transistors 23 and 24 forming the sense amplifier 20.

Figure 3:
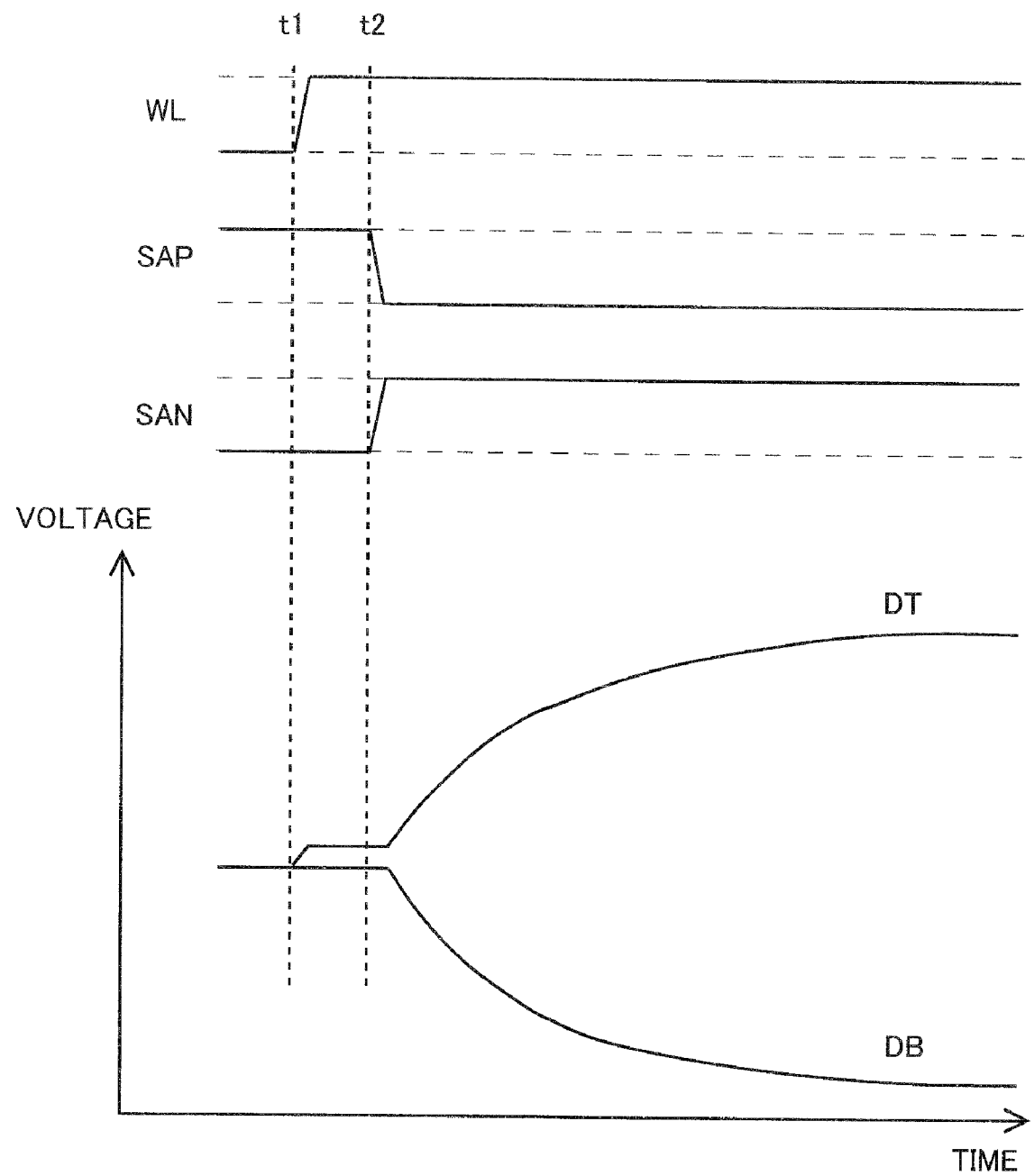
FIG. 3 is a timing chart of an operation in the DRAM circuit according to the first exemplary embodiment.

Now, explanation will, be made on the operation in the DRAM circuit 1 according to the first exemplary embodiment. A case in which the memory cell 10 stores the high level data will be described. FIG. 3 shows a timing chart describing the operation of the DRAM circuit 1. The bit lines DT and DB of the DRAM circuit 1 are charged to HVDD (VDD/2) by a precharge circuit (not shown) and an equalizer (not shown) when the access to the memory cell 10 is not performed or when the word select signal WL transmitted to the word line 51 is in the low level.

At time t1, the word select signal WL transmitted to the word line 51 is in the high level, and the gate transistor 11 is in the conduction state. The charge held by the capacitor 12 of the memory cell 10 is transmitted to the bit line DT, and the potential of the bit line DT slightly increases.

At time t2, the control signal SAP transmitted from the control circuit 40 to the control line 52 is lowered to the low level. At the same time, the control signal SAN transmitted from the control circuit 40 to the control line 53 is raised to the high level. Accordingly, the PMOS transistor 25 and the NMOS transistor 26 are in the conduction state at the same time, and the node A1 and the power supply voltage terminal 30, and the node A2 and the ground voltage terminal 31 are electrically connected, so as to activate the sense amplifier 20. Accordingly, the potential of the bit line DT which is slightly higher than that of the bit line DB is raised to the power supply voltage VDD through the PMOS transistors 21 and 22 of the sense amplifier 20. At the same time, the potential of the bit line DB which is slightly lower than that of the bit line DT is lowered to the ground voltage VSS through the NMOS transistors 23 and 24 of the sense amplifier 20.

Therefore, the data stored in the memory cell 10 is amplified due to the above operation, and the potential of the bit lines DT and DB are output to the external output device. Although not shown in the drawing, the word select signal WL is then lowered to the low level and the sense amplifier 20 stops the operation, so that the potential of the bit lines DT and DB are again made HVDD (VDD/2) by the precharge circuit and the equalizer.

From the above description, in the DRAM circuit 1 according to the first exemplary embodiment, the NMOS transistors 23, 24 and the PMOS transistors 21, 22 are operated at the same time when the sense amplifier 20 is activated in a low power supply voltage where the power supply voltage VDD is 1.2 V or lower. This operation is performed by setting the PMOS transistor 25 and the NMOS transistor 26 to the conduction state at the same time.

In a low power supply voltage where the power supply voltage VDD is 1.2 V or lower, the power supply voltage VDD and the threshold value voltage of the transistor forming the sense amplifier 20 are close to each other, and it is difficult to operate the transistor and to activate the sense amplifier 20. Accordingly, when the variation of the threshold value voltage of the transistor formed in the sense amplifier 20 is large, it has an adverse effect on the stability of the operation of the sense amplifier 20.

However, in recent years, the variation of the threshold value voltage of the PMOS transistors 21 and 22 forming the sense amplifier 20 is almost the same to that of the NMOS transistors 23 and 24 as the manufacturing process has been highly developed, as described above. Accordingly, also in the low power supply voltage where the power supply voltage VDD is 1.2 V or lower, the PMOS transistors 21 and 22 can perform the operation of conduction and non-conduction with the stable threshold value voltage having smaller variation as in the same way as the NMOS transistors 23 and 24. Accordingly, even when the PMOS transistor 25 and the NMOS transistor 26 are turned on at the same time and the NMOS transistors 23 and 24 and the PMOS transistors 21 and 22 are operated at the same time at time t2 in FIG. 3, there is no problem caused in the stability of the operation of the sense amplifier 20. Hence, there is no problem caused in the stability of the operation of the DRAM circuit 1 as well.

Further, there is no need to perform the operation of the NMOS transistor forming the sense amplifier earlier unlike the related art, which makes it possible to operate the NMOS transistor and the PMOS transistor at the same time. Accordingly, the speed of the amplification operation of the sense amplifier becomes higher. Such an effect is prominent when the power supply voltage VDD is equal to 1.0 V or lower.

Since the NMOS transistors 23 and 24 and the PMOS transistors 21 and 22 are operated at the same time, the pass-through current flows in the sense amplifier 20, which may cause the adverse effect such as the power consumption or the noise. However, in the first exemplary embodiment, the power supply voltage VDD is not so high compared with the related art and the voltage is 1.2 V or lower; therefore the power supply voltage VDD and the threshold value voltage of the transistor forming the sense amplifier 20 are close to each other and it is difficult to operate the sense amplifier 20. Accordingly, even when the PMOS transistor 25 and the NMOS transistor 26 are made the conduction state at the same time and the sense amplifier 20 is activated, the pass-through current hardly flows unlike the related art. Hence, as shown in FIG. 3, there is no problem even when the PMOS transistor 25 and the NMOS transistor 26 are turned on at the same time to operate the NMOS transistors 23 and 24 and the PMOS transistors 21 and 22 of the sense amplifier 20.

Figure 4:
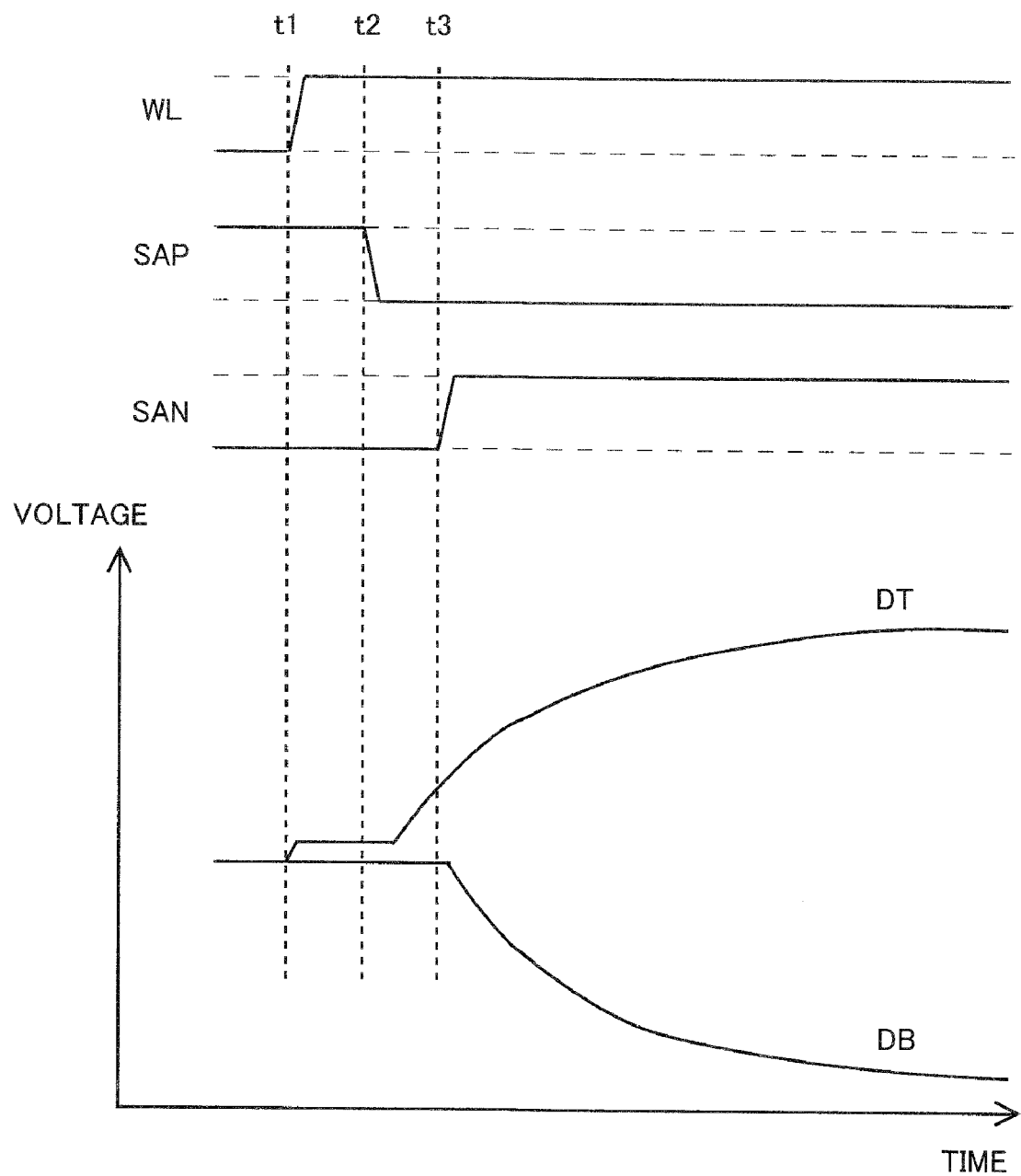
FIG. 4 is another timing chart of the operation in the DRAM circuit according to the first exemplary embodiment.

The operation of the DRAM circuit 1 due to the timing chart of FIG. 3 can be applied to a case where the variation of the threshold value voltage of the NMOS transistors 23 and 24 and that of the PMOS transistors 21 and 22 are almost the same. Further, when the variation of the threshold value voltage of the PMOS transistor decreases to be smaller than the variation of the threshold value voltage of the NMOS transistor, the PMOS transistor may be operated earlier than the NMOS transistor when the sense amplifier 20 is activated. FIG. 4 shows a timing chart in this case.

Hereinafter, the operation of the DRAM circuit 1 will be described according to the timing chart shown in FIG. 4. In FIG. 4, the memory cell 10 stores the high level data as in the same as FIG. 3.

At time t1, the word select signal WL transmitted to the word line 51 is in the high level, and the gate transistor 11 is in the conduction state. Accordingly, the charge held in the capacitor 12 of the memory cell 10 is transmitted to the bit line DT and the potential of the bit line DT slightly increases.

At time t2, the control signal SAP transmitted from the control circuit 40 to the control line 52 is lowered to the low level. Accordingly, the PMOS transistor 25 is in the conduction state and the node A1 and the power supply voltage terminal 30 are electrically connected to activate the sense amplifier 20. Therefore, the potential of the bit line DT which is slightly higher than that of the bit line DB is raised to the power supply voltage VDD through the PMOS transistors 21 and 22 of the sense amplifier 20.

At time t3, the control signal SAN transmitted from the control circuit 40 to the control line 53 is raised to the high level. Therefore, the NMOS transistor 26 is in the conduction state and the node A2 and the ground voltage terminal 31 are electrically connected. Accordingly, the potential of the bit line DB which is lower than that of the bit line DT is lowered to the ground voltage VSS through the NMOS transistors 23 and 24 of the sense amplifier 20.

According to the above operation, the data stored in the memory cell 10 is amplified and the potential of the bit lines DT and DB is output to the external output device. Although not shown in the drawing, the word select signal WL is then lowered to the low level and the sense amplifier 20 stops the operation so that the potential of the bit lines DT and DB is again set to HVDD (VDD/2) by the precharge circuit and the equalizer.

From the above description, in the DRAM circuit 1 operating in the timing chart of FIG. 4, the PMOS transistors 21 and 22 are operated earlier than the NMOS transistors 23 and 24 when the sense amplifier 20 is activated in the low power supply voltage where the power supply voltage VDD is 1.2 V or smaller. This is performed by making the PMOS transistor 25 conduction state earlier than the NMOS transistor 26.

The PMOS transistors 21 and 22 forming the sense amplifier 20 according to the first exemplary embodiment has a smaller variation of the threshold, value voltage compared with the NMOS transistors 23 and 24 due to the highly integrated manufacturing process. Accordingly, also in the low power supply voltage where the power supply voltage VDD is 1.2 V or lower, the PMOS transistors 21 and 22 can perform the operation of conduction and non-conduction with the stable threshold value voltage having smaller variation. Therefore, according to the exemplary embodiment, the PMOS transistor 25 is in the conduction state earlier than the NMOS transistor 26 to operate the PMOS transistors 21 and 22 of the sense amplifier 20 earlier as described above, whereby the stable operation can be realized compared with a case of operating the NMOS transistors 23 and 24 earlier as in the related art. Such an effect is more prominent when the power supply voltage VDD is 1.0 V or lower.

Second Exemplary Embodiment

Figure 5:
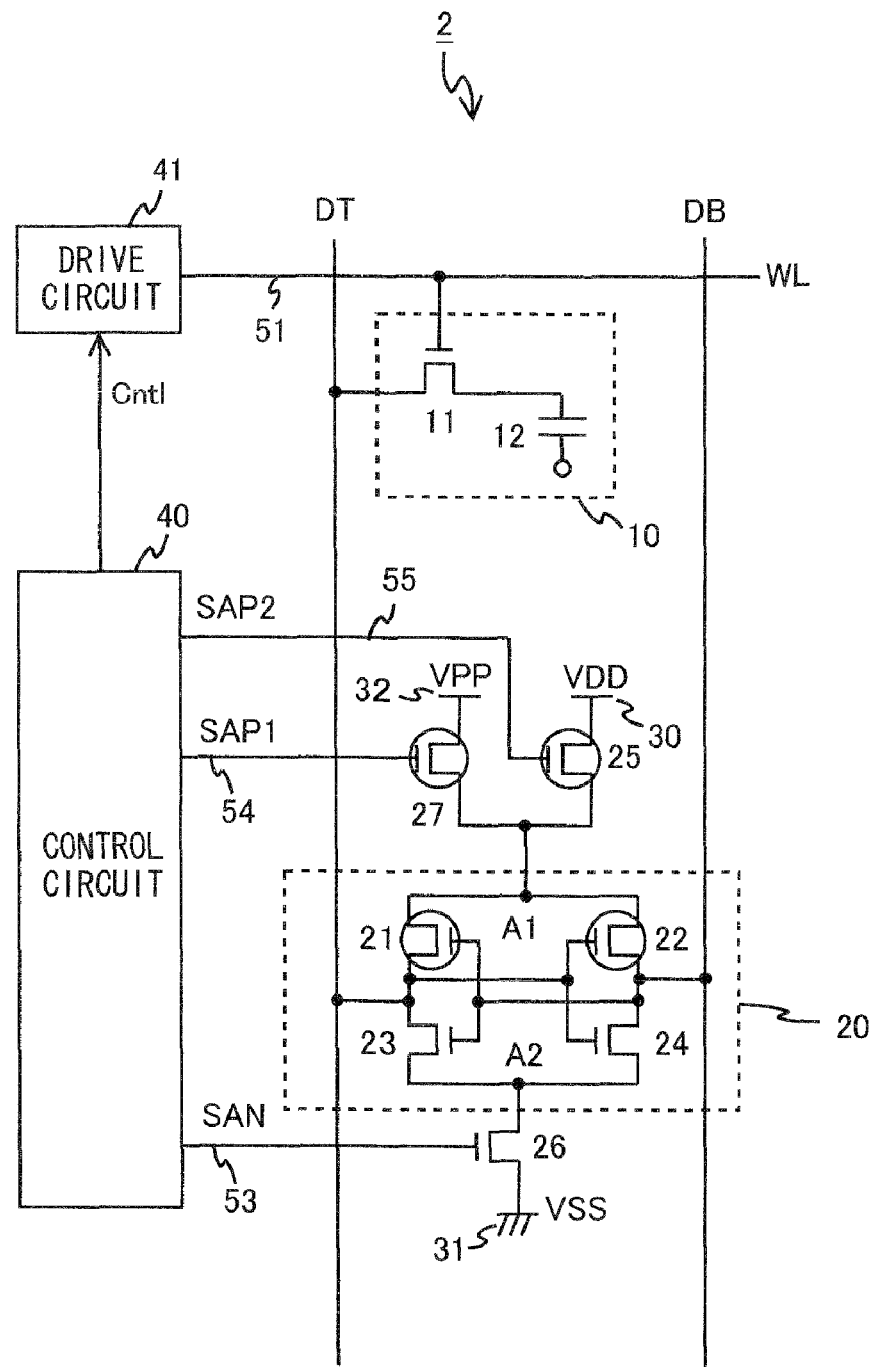
FIG. 5 is a configuration of a DRAM circuit according to a second exemplary embodiment.

FIG. 5 shows a circuit diagram of a DRAM circuit 2 according to the second exemplary embodiment. As shown in FIG. 5, the DRAM circuit 2 further includes a PMOS transistor 27 between the sense amplifier 20 and a terminal 32 supplying VPP whose voltage is higher than the power supply voltage VDD (hereinafter referred to as VPP voltage terminal). Further, the PMOS transistor 27 and the control circuit 40 are connected by a control line 54. The description of the sense amplifier 20 will be omitted since it is the same as that of the first exemplary embodiment.

The PMOS transistor 27 has a source connected to the VPP voltage terminal 32, a drain connected to the node A1, and a gate connected to the control line 54. The PMOS transistor 25 has a source connected to the power supply voltage terminal 30, a drain connected to the node A1, and a gate connected to a control line 55.

The control circuit 40 transmits a control signal SAP1 by the control line 54 to control the conduction state of the PMOS transistor 27. The control circuit 40 transmits a control signal SAP2 by the control line 55 to control the conduction state of the PMOS transistor 25. Further, the control circuit 40 transmits the control signal SAN by the control line 53 to control the conduction state of the NMOS transistor 26. The control circuit 40 sets the PMOS transistors 25 and 27 to the conduction state earlier than setting the NMOS transistor 26 or at the same time when the NMOS transistor 26 is set to the conduction state by the control signal transmitted to the control lines SAP1, SAP2, and SAN when the sense amplifier 20 is activated. Further, as is the same way as in the first exemplary embodiment, the control circuit 40 transmits the control signal Cntl to the drive circuit 41. The drive circuit 41 makes the word select signal WL high level according to the control signal Cntl.

Figure 6:
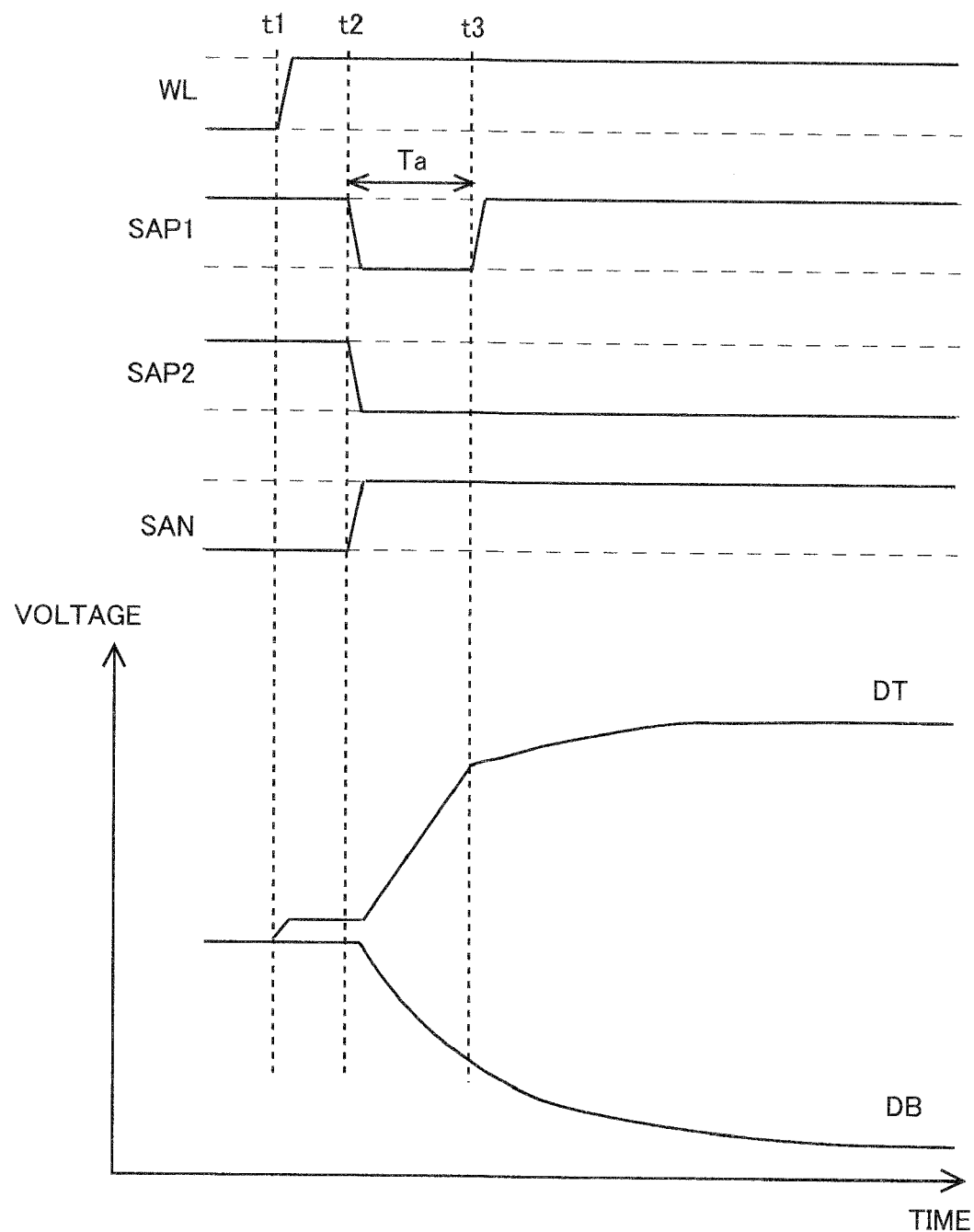
FIG. 6 is a timing chart of an operation in the DRAM circuit according to the second exemplary embodiment.

Now, the description will be made on the operation in the DRAM circuit 2 according to the exemplary embodiment. In this description, a case in which the memory cell 10 stores the high level data will be described. FIG. 6 shows a timing chart describing the operation of the DRAM circuit 2. Note that the bit lines DT and DB of the DRAM circuit 2 are precharged to HVDD (VDD/2) by the precharge circuit (not shown) and the equalizer (not shown) when the access to the memory cell 10 is not performed or when the word select signal WL transmitted to the word line 51 is in the low level.

At time t1, the word select signal WL transmitted to the word line 51 is in the high level and the gate transistor 11 is in the conduction state. Accordingly, the charge held in the capacitor 12 of the memory cell 10 is transmitted to the bit line DT and the potential of the bit line DT slightly increases.

At time t2, the control signals SAP1 and SAP2 transmitted from the control circuit 40 to the control lines 54 and 55 are lowered to the low level. At the same time, the control signal SAN transmitted from the control circuit 40 to the control line 53 is raised to the high level. Accordingly, the PMOS transistors 27, 25 and the NMOS transistor 26 are in the conduction state at the same time, and the node A1 and the VPP voltage terminal 32, the node A1 and the power supply voltage terminal 30, and the node A2 and the ground voltage terminal 31 are electrically connected to activate the sense amplifier 20. Accordingly, the potential of the bit line DT which is slightly higher than the potential of the bit line DB is raised to the power supply voltage VDD through the PMOS transistors 21 and 22 of the sense amplifier 20. At the same time, the potential of the bit line DB which is slightly lower than that of the bit line DT is lowered to the ground voltage VSS through the NMOS transistors 23 and 24 of the sense amplifier 20.

At time t3, the control signal SAP1 transmitted from the control circuit 40 to the control line 54 is raised to the high level. Accordingly, the PMOS transistor 27 is in the non-conduction state, and the operation of raising the voltage of the bit line DT to the high potential VPP side through the PMOS transistors 21 and 22 is completed. However, since the control signal SAP2 is in the high level, the sense amplifier 20 continues to raise the bit line DT to the power supply voltage VDD through the PMOS transistors 21 and 22.

Accordingly, the data stored in the memory cell 10 is amplified according to the above operation, and the potential of the bit lines DT and DB is output to the external output device. Although not shown in the drawing, the word select signal WL is then lowered to the low level, and the sense amplifier 20 stops the operation. Then the potential of the bit lines DT and DB is again set to HVDD (VDD/2) by the precharge circuit and the equalizer.

During the period Ta from time t2 to t3, the node A1 is electrically connected to the VPP voltage terminal 32 supplying the voltage VPP which is higher than the power supply voltage VDD. Accordingly, the potential of the bit line DT is raised to the higher potential side by two power supplies supplying VDD and VPP during the period of Ta. Accordingly, it is possible to quickly increase the potential of the bit line DT to a high potential side compared with a case where the node A1 is only connected to the power supply voltage terminal 30 as in the first exemplary embodiment. However, when the period Ta is longer than needed, the potential of the node A1 increases up to the power supply voltage VDD or higher, and the pass-through current flows from the VPP voltage terminal 32 to the power supply voltage terminal 30. Hence, the control circuit 40 performs controlling so that the operation is completed somewhat before the operation of raising the voltage of the bit line DT to the power supply voltage VDD by the control signal SAP1 in the period Ta where the PMOS transistor 27 is in the conduction state.

From the above description, in the DRAM circuit 2 operating in the timing chart of FIG. 6, the NMOS transistors 23, 24 and the PMOS transistors 21, 22 are operated at the same time when the sense amplifier 20 is activated in the low power supply voltage where the power supply voltage VDD is 1.2 V or lower. This is performed by setting the PMOS transistors 25, 27 and the NMOS transistor 26 to the conduction state at the same time.

Now, the variation of the threshold value voltage of the PMOS transistors 21 and 22 forming the sense amplifier 20 is almost the same to that of the NMOS transistors 23 and 24 as the manufacturing process has been highly developed as is the same way as in the first exemplary embodiment. Accordingly, even in the low power supply voltage where the power supply voltage VDD is 1.2 V or lower, the operation of conduction and non-conduction can be performed with the stable threshold value voltage having smaller variation in the PMOS transistors 21 and 22 as in the same way as the NMOS transistors 23 and 24. Hence, even when the PMOS transistors 25 and 27 and the NMOS transistor 26 are turned on at the same time and the NMOS transistors 23 and 24 and the PMOS transistors 21 and 22 are operated at the same time at time t2 in FIG. 6, there is no problem caused in the stability of the operation of the sense amplifier 20. Hence, there is no problem caused in the stability of the operation of the DRAM circuit 2 as well.

Furthermore, there is no need to perform the operation of the NMOS transistor forming the sense amplifier earlier unlike the related art; therefore the PMOS transistor and the NMOS transistor can be operated at the same time. Accordingly, the speed of the amplification operation of the sense amplifier becomes higher. Further, since the two power supplies supplying the potential of VDD and VPP raise the potential of one of the bit lines to the high potential side during the period Ta, the amplification speed of the sense amplifier 20 can further be increased Such an effect is prominent when the power supply voltage VDD is 1.0 V or lower.

Figure 7:
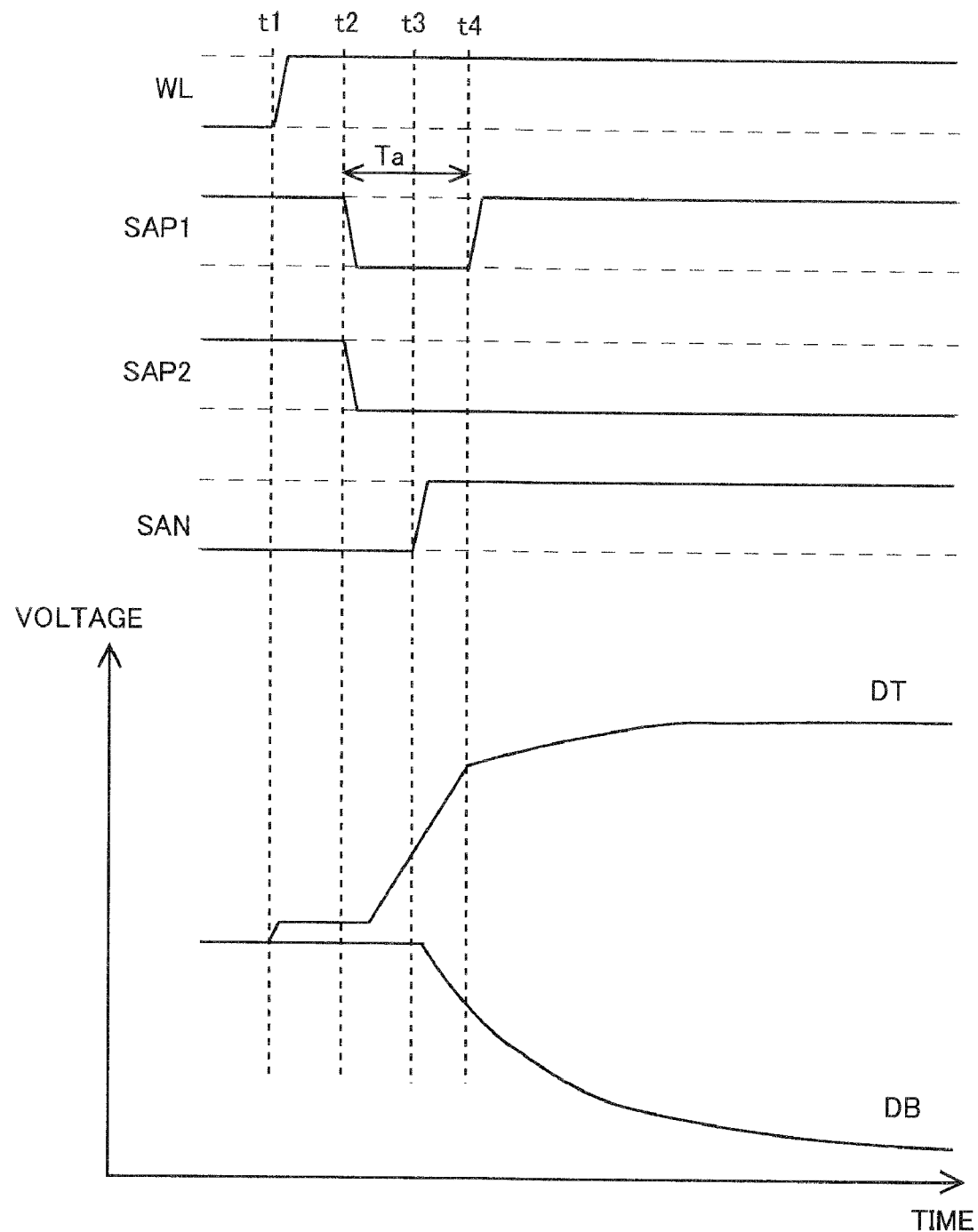
FIG. 7 is another timing chart of the operation in the DRAM circuit according to the second exemplary embodiment.

Now, the operation of the DRAM circuit 2 according to the timing chart of FIG. 6 can be applied to a case in which the variation of the threshold value voltage of the NMOS transistors 23 and 24 is almost the same as the variation of the threshold value voltage of the PMOS transistors 21 and 22. When the variation of the threshold value voltage of the PMOS transistor is further decreased to be smaller than that of the NMOS transistor, the PMOS transistor may be operated earlier than the NMOS transistor when the sense amplifier 20 is activated. FIG. 7 shows a timing chart in this case.

The operation of the DRAM circuit 2 will now be described in accordance with the timing chart shown in FIG. 7. In FIG. 7, the memory cell 10 stores high level data as in the same as FIG. 6.

At time t1, the word select signal WL transmitted to the word line 51 is in the high level, and the gate transistor 11 is in the conduction state. Accordingly, the charge held in the capacitor 12 of the memory cell 10 is transmitted to the bit line DT, and the potential of the bit line DT slightly increases.

At time t2, the control signals SAP1 and SAP2 transmitted from the control circuit 40 to the control lines 54 and 55 are lowered to the low level. Therefore, the PMOS transistors 27 and 25 are in the conduction state, and the node A1 and the power supply voltage terminal 30, and the node A1 and the VPP voltage terminal 32 are electrically connected to activate the sense amplifier 20. Therefore, the potential of the bit line DT which is slightly higher than that of the bit line DB is raised to the high potential VPP side through the PMOS transistors 21 and 22 of the sense amplifier 20.

At time t3, the control signal SAN transmitted from the control circuit 40 to the control line 53 is raised to the high level. Accordingly, the NMOS transistor 26 is in the conduction state, and the node A2 and the ground voltage terminal 31 are electrically connected. Therefore, the potential of the bit line DB which is lower than that of the bit line DT is lowered to the ground voltage VSS through the NMOS transistors 23 and 24 of the sense amplifier 20.

At time t4, the control signal SAP1 transmitted from the control circuit 40 to the control line 54 is raised to the high level. Accordingly, the PMOS transistor 27 is in the non-conduction state, and the operation of raising the voltage of the bit line DT to the high voltage VPP side through the PMOS transistors 21 an 22 is completed. However, since the control signal SAP2 is in the high level, the sense amplifier 20 continues to raise the bit line DT to the power supply voltage VDD through the PMOS transistors 21 and 22.

Accordingly, the data stored in the memory cell 10 is amplified due to the above operation, and the potential of the bit lines DT and DB is output to the external output device. Although not shown in the drawing, the word select signal WL is then lowered to the low level and the sense amplifier 20 stops the operation, and the potential of the bit lines DT and DB is again set to HVDD (VDD/2) by the precharge circuit and the equalizer.

From the above description, in the DRAM circuit 2 operating in the timing chart of FIG. 7, the PMOS transistors 21 and 22 are operated earlier than the NMOS transistors 23 and 24 when the sense amplifier 20 is activated in the low power supply voltage where the power supply voltage VDD is 1.2 V or lower. This is performed by making the PMOS transistors 27 and 25 the conduction state earlier than the NMOS transistor 26.

As in the same way as the first exemplary embodiment, the PMOS transistors 21 and 22 forming the sense amplifier 20 according to the second exemplary embodiment has a less variation of the threshold value voltage compared with the NMOS transistors 23 and 24 due to the highly integrated manufacturing process. Accordingly, even in the low power supply voltage where the power supply voltage VDD is 1.2 V or lower, the PMOS transistors 21 and 22 can perform the operation of conduction and non-conduction with the stable threshold value voltage having smaller variation. Therefore, as described above, the PMOS transistor 25 is in the conduction state earlier than the NMOS transistor 26 to operate the PMOS transistors 21 and 22 of the sense amplifier 20 earlier as described above. Accordingly, it is possible to realize the stable operation compared with a case in which the NMOS transistors 23 and 24 are operated earlier as in the related art. Such an effect is more prominent when the power supply voltage VDD is 1.0 V or lower. Further, since the two power supplies supplying the potential of VDD and VPP raise the potential of one of the bit lines during the period Ta, it is possible to increase the operational speed of the sense amplifier 20.

Note that the present invention is not limited to the above exemplary embodiments but can be changed as appropriate without departing from the spirit of the invention. For example, as shown in a DRAM 3 of FIG. 8, an NMOS transistor 28 may further be included between the node A2 and the terminal 33 supplying VKK (hereinafter referred to as VKK voltage terminal) which is lower than the ground voltage VSS. The NMOS transistor 28 has a gate connected to a control line 57, and the conduction and non-conduction of the NMOS transistor 28 are controlled by a control signal SAN1 from the control circuit 40.

Figure 9:
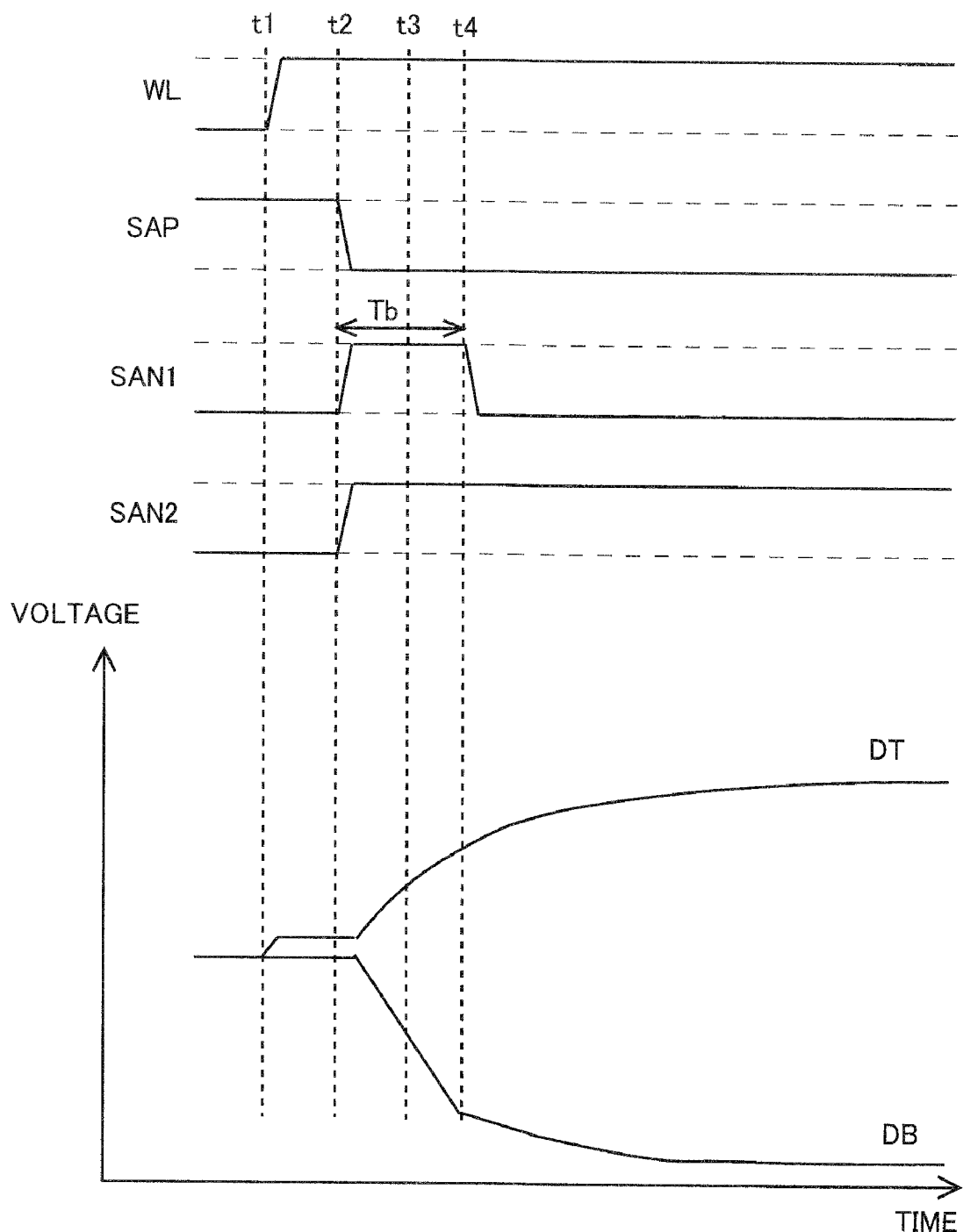
FIG. 9 is a timing chart of an operation in the DRAM circuit according to another exemplary embodiment.
Figure 10:
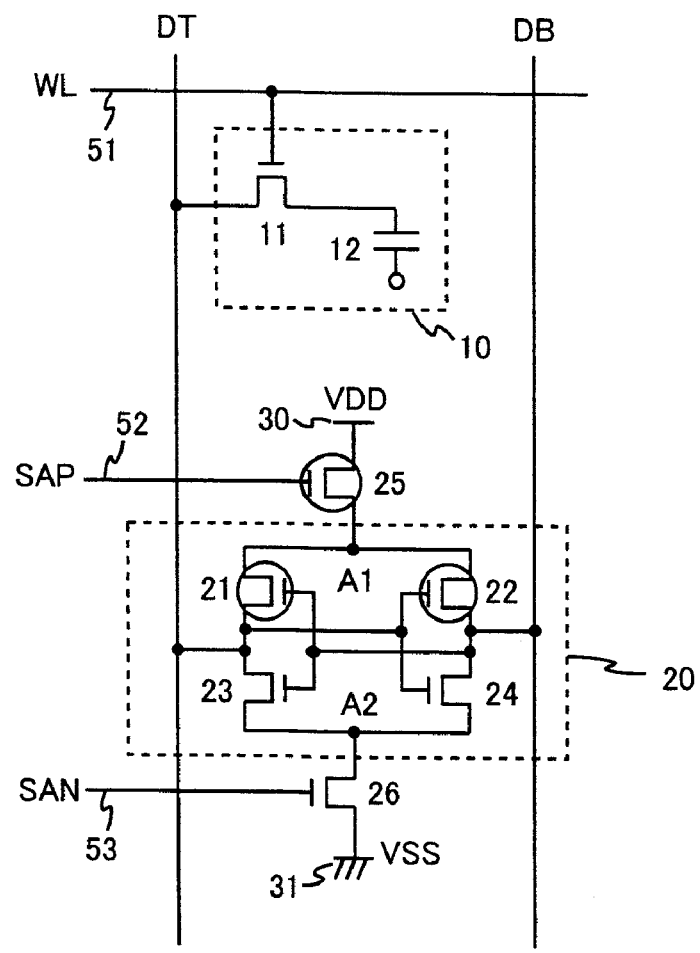
FIG. 10 is a configuration of a general DRAM circuit.
Figure 11:
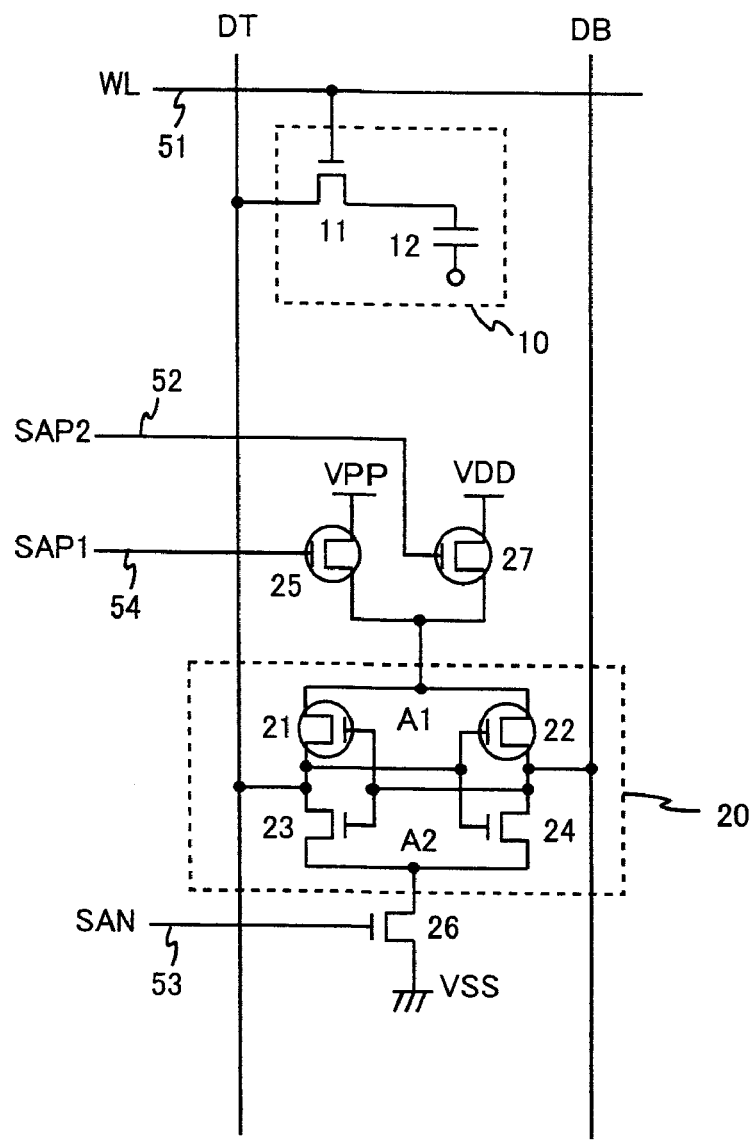
FIG. 11 is a configuration of a DRAM circuit according to a prior art.
Figure 12:
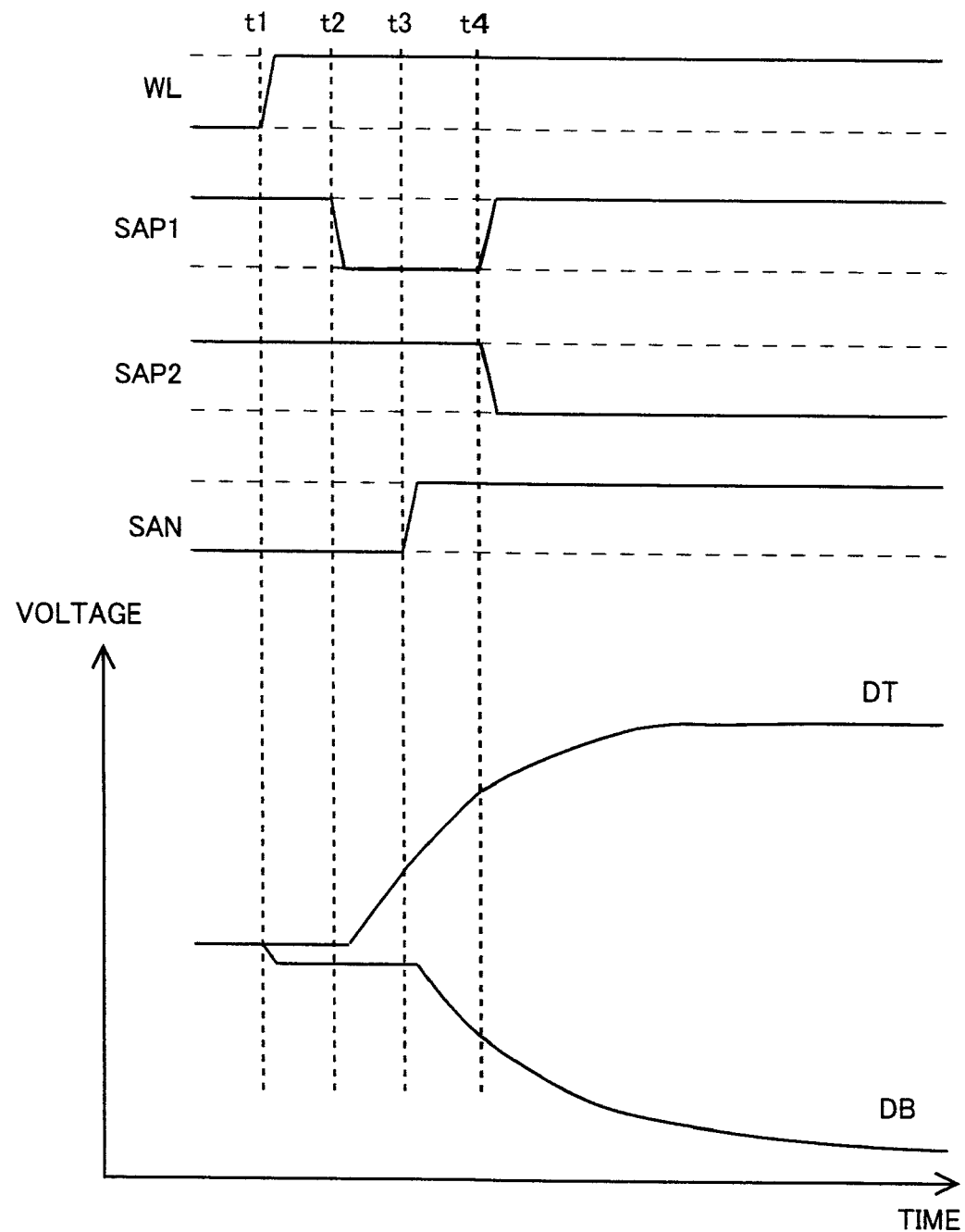
FIG. 12 is another timing chart of an operation in the DRAM circuit according to the prior art.

FIG. 9 shows a timing chart of the DRAM 3. Note that the memory cell 10 stores the high level data as an example. As shown in FIG. 9, the control signal SAP is lowered and the control signals SAN1 and SAN2 are raised at time t2. Accordingly, the potential of the bit line DB is quickly lowered to the low potential VPP side during the period Tb, and it is possible to increase the operational speed of the sense amplifier 20. Even in this case, the stable operation of the sense amplifier 20 can be realized compared with a case of operating the NMOS transistors 23 and 24 of the sense amplifier 20 earlier. However, when the period Tb is longer than needed, the pass-through current flows from the ground voltage terminal 31 to the VKK voltage terminal 33. Hence, the control circuit 40 performs controlling so that the operation is completed somewhat before the operation of lowering the voltage of the bit line DB to the ground voltage VSS by the control signal SAN1.

Figure 8:
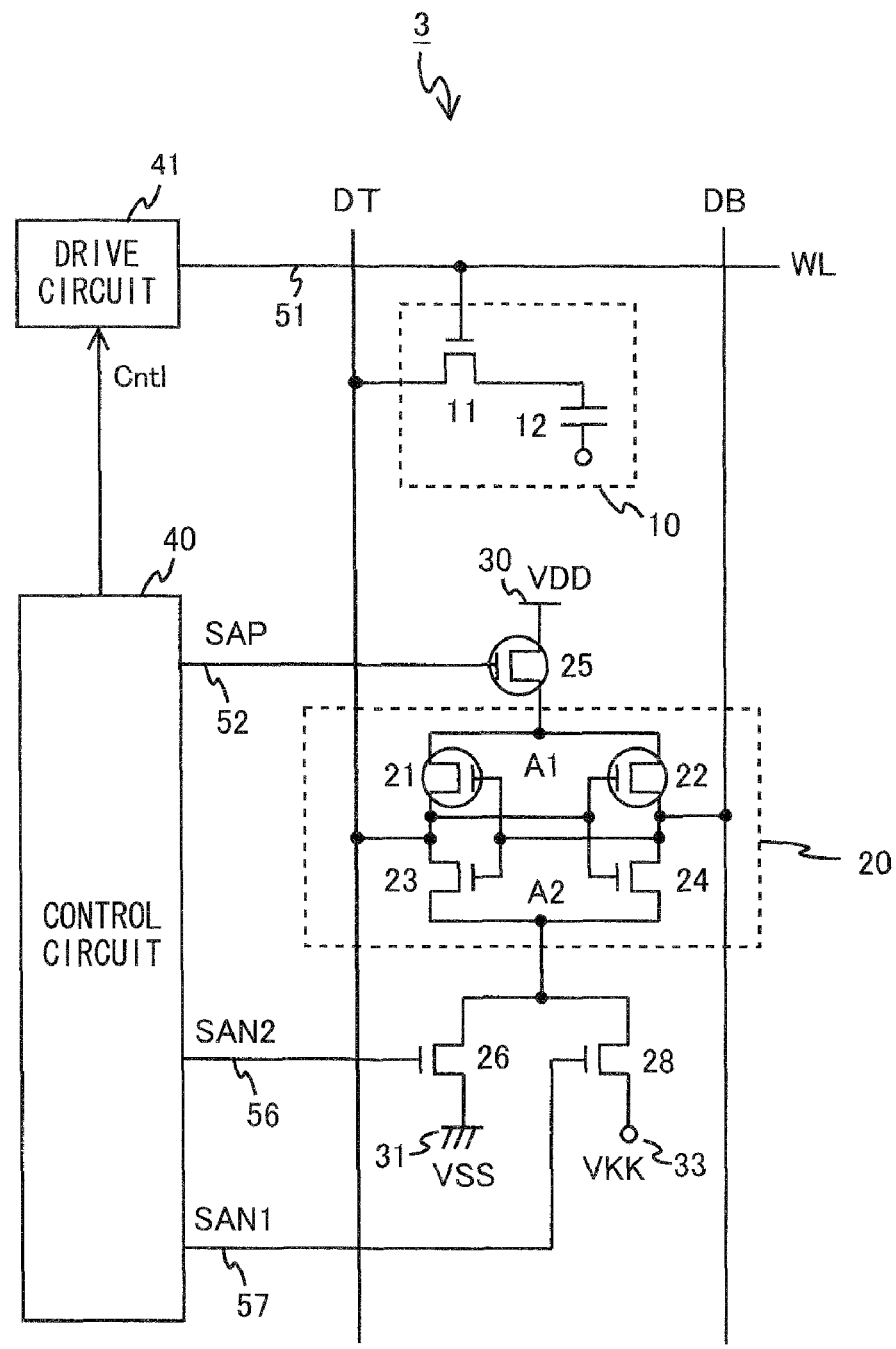
FIG. 8 is a configuration of a DRAM circuit according to another exemplary embodiment.

Further, it is also possible to combine the circuit configuration of FIG. 8 and that of FIG. 5.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor storage device, comprising:
   a sense amplifier having a power supply voltage of 1.2 V or lower and amplifying a potential difference between a bit line pair;
   a first transistor supplying the power supply voltage to the sense amplifier;
   a second transistor supplying a low potential side voltage to the sense amplifier; and
   a control circuit controlling the first transistor to be a conduction state before the second transistor is set to the conduction state or at the same time when the second transistor is set to the conduction state.

2. The semiconductor storage device according to claim 1, further comprising a third transistor connected to the first transistor in parallel and supplying a voltage higher than the power supply voltage, wherein
   the third transistor is controlled by the control circuit to be the conduction state at the same time when the first transistor is set to the conduction state.

3. The semiconductor storage device according to claim 2, wherein the third transistor is controlled by the control circuit to be a non-conduction state before a potential of one of the bit line pair reaches the power supply voltage.

4. The semiconductor storage device according to claim 1, further comprising a fourth transistor connected to the second transistor in parallel and supplying a voltage lower than the low potential side power supply, wherein
   the fourth transistor is controlled by the control circuit to be the conduction state at the same time when the second transistor is set to the conduction state.

5. The semiconductor storage device according to claim 4, wherein the fourth transistor is controlled by the control circuit to be a non-conduction state before a potential of one of the bit line pair reaches the voltage of the low-potential side power supply.

6. A semiconductor storage device, comprising:
   a memory cell connected to each of complementary bit lines;
   a word line connected to the memory cell;
   a sense amplifier connected between the complementary bit lines;
   a first switch circuit selectively applying a first voltage of 1.2 V or lower to the sense amplifier;
   a second switch circuit selectively applying a second voltage which is lower than the first voltage to the sense amplifier; and
   a control circuit activating the first switch circuit earlier than the second switch circuit or at the same time when the second switch circuit is activated.

7. The semiconductor storage device according to claim 6, further comprising a drive circuit driving the word line; wherein
   the control circuit controls the drive circuit so that a timing at which the word line is activated is earlier than a timing at which the first switch circuit is activated.

* * * * *